US006091050A

United States Patent [19]

Carr

[11] Patent Number: 6,091,050

[45] Date of Patent: Jul. 18, 2000

[54] THERMAL MICROPLATFORM

[75] Inventor: William N. Carr, Montclair, N.J.

[73] Assignee: Roxburgh Limited, Douglas, United Kingdom

[21] Appl. No.: 08/972,055

[22] Filed: Nov. 17, 1997

[51] Int. Cl.[7] .............................. H05B 1/00; H01L 29/82

[52] U.S. Cl. ............................................ 219/201; 257/415

[58] Field of Search ............................ 219/201; 257/414, 257/415, 116, 417, 418, 419; 73/504.15, 517 R

[56] References Cited

U.S. PATENT DOCUMENTS

| | | | |
|---|---|---|---|
| 4,556,050 | 12/1985 | Hodgson et al. | 121/1 R |
| 4,736,629 | 4/1988 | Cole | 73/517 R |
| 5,058,856 | 10/1991 | Gordon et al. | 251/11 |
| 5,140,155 | 8/1992 | Carome | 250/227.21 |
| 5,295,206 | 3/1994 | Mischenko | 385/12 |
| 5,475,318 | 12/1995 | Marcus et al. | 324/762 |
| 5,536,963 | 7/1996 | Polla | 257/417 |
| 5,626,779 | 5/1997 | Okada | 219/201 |
| 5,635,750 | 6/1997 | Schlaak et al. | 257/414 |
| 5,659,195 | 8/1997 | Kaiser et al. | 257/415 |
| 5,796,152 | 8/1998 | Carr et al. | 257/415 |
| 5,810,325 | 9/1998 | Carr | 251/30.02 |

OTHER PUBLICATIONS

The 8th Internat'l Conference on Solid–State Sensors and Actuators and Eurosensors IX–Digest of Technical Papers, pp. 818–821, Jun. 25–29, 1995, vol. 2, Fung et al., "Thermal Analysis and Design of a Micro–Hotplate for Integrated Gas Sensor Applications".

Proceedings of SPIE, Smart Structures and Meterials 1997, vol. 3046, pp. 273–283, Manginell et al., "An Overview of Micromachined Platforms for Thermal Sensing and Gas Detection".

*Primary Examiner*—Teresa Walberg
*Assistant Examiner*—Daniel Robinson
*Attorney, Agent, or Firm*—Ohlandt, Greeley, Ruggiero & Perle, L.L.P.

[57] ABSTRACT

A micromachined platform structure includes a substrate having a major surface and a platform positioned over the major surface. Plural support beams are tethered between the substrate and the platform, with each support beam including at least a first layer exhibiting a first thermal coefficient of expansion (TCE) and a second layer with a second TCE, the first TCE greater than the second TCE. The first layer is deposited on the second layer at a temperature that is higher than an ambient temperature at which the platform is to be used. Thus, at the ambient use temperature, the first layer is in a contraction/tension state relative to the second layer and causes a flexure of the support beams and an elevation of the platform away from the substrate's major surface.

13 Claims, 5 Drawing Sheets

THERMAL MICROPLATFORM

FIELD OF THE INVENTION

This invention relates to micromachined semiconductor structures and, more particularly, to a thermally isolated microplatform that is rendered into position automatically during processing, upon elimination of a release layer.

BACKGROUND OF THE ART

The availability of micromachining technology has permitted the development of new classes of semiconductor-based microdevices for a variety of applications. Such technology, when based on batch processing with standard semiconductor clean room processes, often provides excellent economies in per unit cost and enhanced reliability for the end product. Micromachining provides the advantages of: design flexibility, ability to make structures of micron and submicron dimensions, batch fabrication at low cost, reliability, reproducibility, easy fabrication of arrays, ability to include control and signal conditioning electronics on a same substrate, and the use of a well established manufacturing infrastructure.

Micromachining with standard semiconductor processing techniques has been used to produce thermally isolated microplatforms which find a number of uses including: calorimetric gas detection, flow sensors, uncooled infra-red sensors, etc. The state of the art for thermally-isolated platforms is described by Manginell, Smith and Ricco in "An Overview of Micromachined Platforms for Thermal Sensing and Gas Detection", Proc. of the SPIE Conference on Smart Electronics and MEMS, Volume 3046, pages 273–383, March, 1997. Manginell et al. describe microplatforms that are suspended above substrate cavities and/or released by the sacrificial etching away of underlying film structures.

Fung et al. in "Thermal Analysis and Design of a Micro-Hotplate for Integrated Gas Sensor Applications" Proc. of the 8th Int;l Conf. on Solid-State Sensors and Actuators, Stockholm, Sweden, pages 818–821, 1995, describe a microhotplate for an integrated gas sensor application. Therein is described a heated microplatform that is thermally isolated from an underlying substrate by suspension microbeams and a micromachined underlying cavity space.

The various applications for thermally-isolated microplatforms are enhanced by controlling the rate of heating or cooling of a microplatform or microplatform array. A suspended microplatform derives thermal isolation from three phenomena which can either cool or heat the microplatform depending upon the specific structures. These phenomena are: radiation, convection, and conduction.

The total power P radiated per unit area of a microplatform is given by $$P_{bb}=K_1A_{bb}T^4$$

where $k_1$ is a constant depending upon the specific surface of the microplatform, A is the effective platform area, and T is the temperature in absolute degrees. Thermal conduction can occur through a gaseous ambient and through thin film support microbeams. The total power conducted through the gaseous ambient or the microsupport beams is given by $$P_{co}=k_2A_{co}(T_2-T_1)$$

where $k_2$ is a constant depending on the specific gas or solid-state film, $A_{co}$ is the effective area cross section for heat flow, and $(T_1-T_2)$ is the differential temperature across which the heat conduction occurs.

The total power flowing away from the microplatform by convection is given by the expression $$P_{cv}=k_3A_{cv}(T_2-T_1)$$

where $k_3$ is a constant depending upon the gas ambient and the surface of the microplatform, $A_{cv}$ is the effective area of the microplatform exposed to convection heat flow, and $(T_2-T_1)$ is the temperature differential between the surface of the microplatform and the ambient gas.

When a microplatform is positioned very close to an underlying substrate, there is a heat flow from the warmer structure to the cooler structure that is typically dominated by a combination of thermal conductivity and gas convective thermal transport. This heat flow decreases as the physical separation between the substrate and the microplatform increases. For microplatforms operating in a gas ambient (atmospheric gas pressure, for instance) substantial increases in thermal isolation of the microplatform can be obtained by increasing the distance between the microplatform and the underlying substrate.

When a support microbeam structure is specifically designed to greatly reduce the thermal conductivity through the microbeams, then increased height of the microplatform over a substrate has an even greater effect of increasing the thermal isolation of the microplatform.

For microplatforms designed for applications such as structural supports for bolometers and thermopiles, a maximum thermal isolation of the microplatform is usually desired so as to increase the sensitivity of the microplatform to incident radiation, generally in the infrared. A temperature sensor mounted on such a microplatform operates with maximum temperature sensitivity to incident radiation when the microsupport beams possess a minimum thermal conductivity. Also for such designs, the thermal isolation of the microplatform is increased further by increasing the separation between the microplatform and the underlying substrate.

SUMMARY OF THE INVENTION

A micromachined platform structure includes a substrate having a major surface and a platform positioned over the major surface. Plural support beams are tethered between the substrate and the platform, with each support beam including at least a first layer exhibiting a first thermal coefficient of expansion (TCE) and a second layer with a second TCE, the first TCE greater than the second TCE. The first layer is deposited on the second layer at a temperature that is higher than an ambient temperature at which the platform is to be used. Thus, at the ambient use temperature, the first layer is in a contraction/tension state relative to the second layer and causes a flexure of the support beams and an elevation of the platform away from the substrate's major surface.

DETAILED DESCRIPTION OF THE INVENTION

The present invention comprises a microplatform that is supported in place by plural microbeams that are tethered to an underlying substrate. The process employed to fabricate the microplatform includes a use of several layers of patterned thin films, one of which is a "sacrificial film", to be etched away near the end of processing, to enable the microplatform and portions of the support beams to be separated from the underlying substrate. Because the microbeams are comprised of layers exhibiting different TCEs and are fabricated at a temperature greater than the ambient at which the microplatform will be used, the release of the microbeams results in a flexure thereof and an elevation of the microplatform.

This invention is related to an invention described in U.S. patent application Ser. No. 08/787,281, entitled: "Cantilevered Microstructure", filed Jan. 24, 1997. To elevate a microplatform therein, however, requires an application of heat to the microcantilevers so as to cause a flexure thereof. The disclosure of the aforementioned patent application is incorporated herein by reference.

For applications where the microplatform is heated, as in micro-hotplates, there is a considerable heat conductivity path via the gas ambient from the microplatform into a lower temperature, underlying substrate. This conductivity path is approximately inversely proportional to the physical separation between the microplatform and the underlying substrate. The present invention permits an elevation of the microplatform permanently to heights of many micrometers above the underlying substrate, thereby increasing the thermal isolation of the microplatform in cases where gaseous thermal conduction is a substantial factor in permitting heat transfer from the microplatform.

Even for cases where a thermally isolated microplatform is operated in a partial vacuum, there can be substantial gaseous thermal conductivity between the microplatform and the underlying substrate. In such a case, there is an advantage in using the present invention as a means of increasing the path for thermal conduction by elevating the microplatform (via released microbeams which actuate upward).

In the present invention the increased separation between the microplatform and the underlying substrate is obtained by causing support microbeams to be comprised of patterned multimorph films. The microplatform therefore is actuated to an elevated, static position immediately upon release from the substrate due to the mismatch in TCEs of the sandwiches of films in the patterned multimorph microbeams.

Figure 1A:
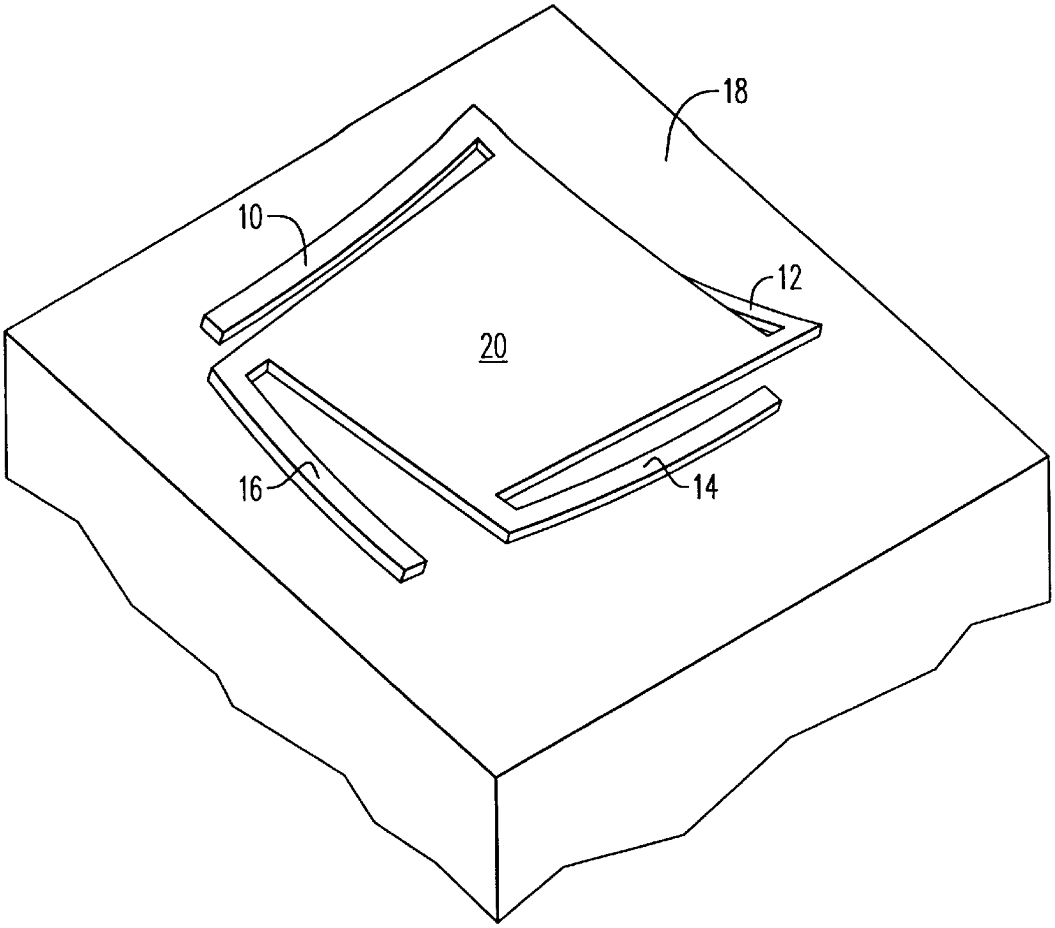
FIG. 1*a* is an isometric view of a thermally-isolated microplatform that is supported by four microbeams above an underlying substrate, and is constructed in accord with the invention hereof.
Figure 1B:
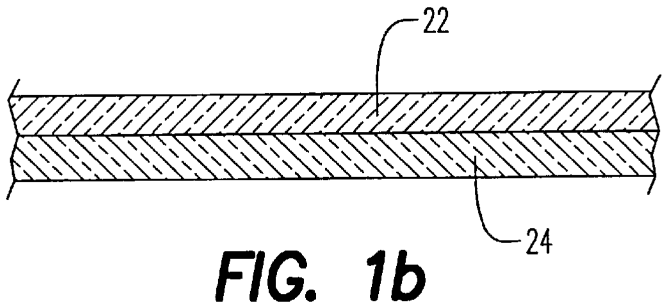
FIG. 1*b* is a sectional view of a microbeam of FIG. 1*a*.

Referring to FIGS. 1*a* and 1*b,* a plurality of multimorph microbeams 10, 12, 14, and 16 are tethered between a substrate 18 and a microplatform 20. The microbeams self-actuate upward upon release of an underlying sacrificial layer and, without additional heating or cooling, act to elevate microplatform 20. This self-actuating to a static position is accomplished by the use of microbeam structures comprising an upper layer (or layers) 22 that is deposited onto a lower layer (or layers) 24. Upper layer 22 exhibits a higher TCE than lower layer 24 of the patterned microbeam.

During the fabrication process, upper layer 22 of a microbeam is deposited at a temperature above the final operating ambient temperature of the microbeam (usually room temperature). For example, if upper layer 22 of the microbeam is deposited at a temperature of 200° C., then at room temperature upper layer 22 will be in tensile stress and will tend to cause the microbeam to bend in a concave-down direction, thereby causing the microplatforn to elevate upward, upon release.

If lower layer 24 of a microbeam is silicon dioxide, then examples of materials available for upper layer 22 that exhibit a higher TCE include: silicon nitride, polycrystalline silicon, titanium, aluminum and most metals.

If there are no electrical connections between microplatform 20 and structures on substrate 18, the microbeams can be fabricated of film materials possessed of minimum thermal conductivity (silicon dioxide and silicon nitride, typically).

Figure 2A:
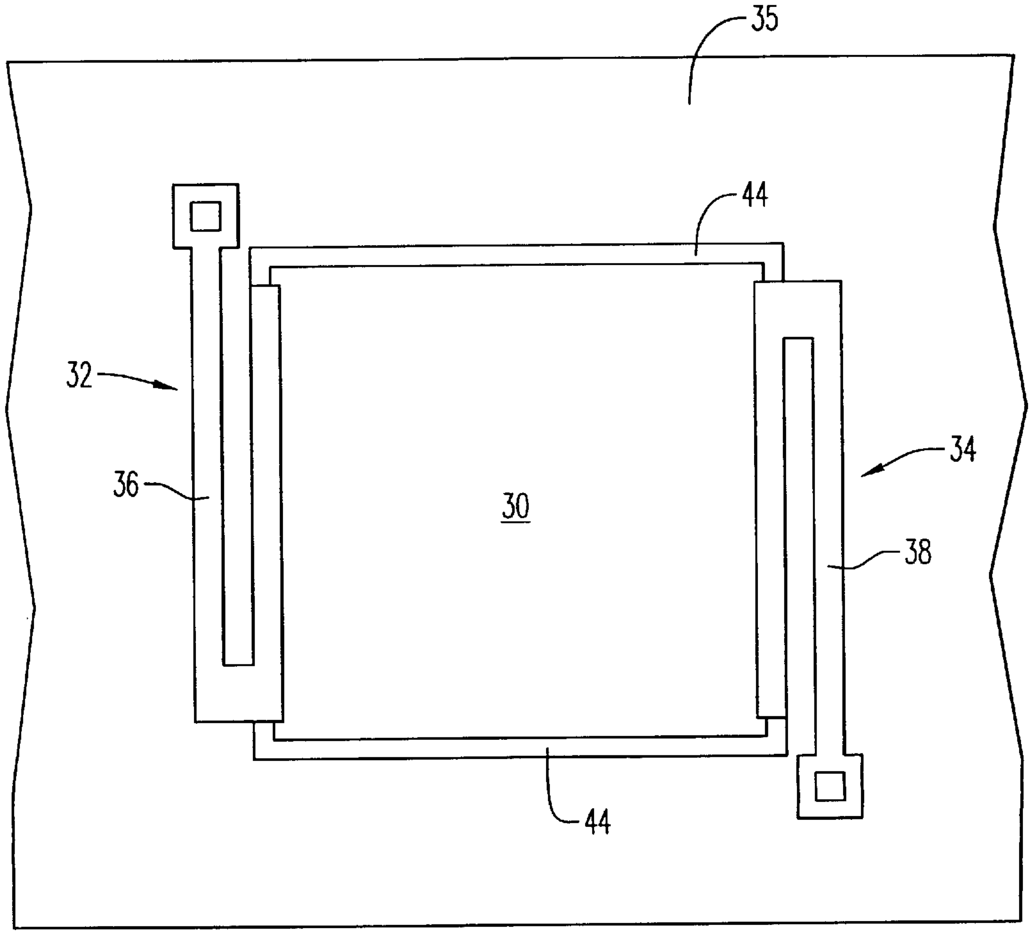
FIG. 2*a* is a top view of a microplatform with an in situ electrical heater area and with two microbeams for support. The microbeams provide the desired upward-actuation of the microplatform and also serve as an electrical path for interconnects to the heater on the microplatform.
Figure 2B:
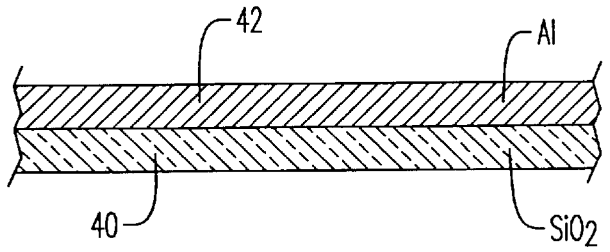
FIG. 2*b* is a sectional view of a microbeam of FIG. 2*a*.

The example of FIG. 2*a* shows a microplatform 30 supported by two microbeams 32 and 34 from substrate 35. Microbeams 32 and 34 also provide electrically conducting paths 36, 38, respectively, for heating microplatform 30. In this embodiment, each of microbeams 32 and 34 (see FIG. 2*b*) comprises a patterned sandwich bimorph, with silicon dioxide as lower layer 40 and aluminum as upper layer 42. The resulting microbeam (32 or 34) will self-actuate upward if aluminum upper layer 42 has been deposited on lower layer 40 at an elevated temperature of 200° C.

Microplatform 30 is formed of sputtered tantalum silicide (and not heated to above 300° C.) that is supported on a silicon dioxide frame 44. The underlying sacrificial layer (not shown) is a polyimide which is sacrificed by an oxygen plasma release etch. Microplatform 30 self-actuates upward following the sacrifice of the polyimide. Microplatform 30 is heated to a desired temperature by controlling the voltage or current that is applied to the tantalum silicide microplatform 30. In fabrication of the structure of FIGS. 2*a* and 2*b*, the maximum process temperature is 300°.

Figure 3A:
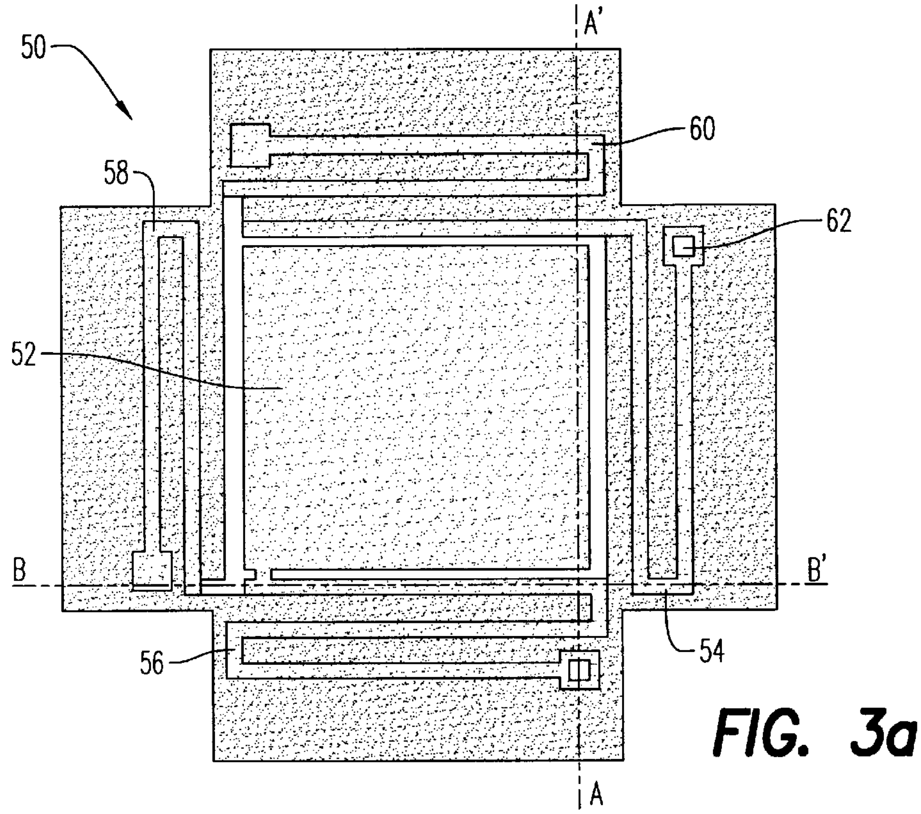
FIG. 3*a* is a top view of a microplatform structure with a heater and four support microbeams.

FIG. 3*a* shows a microplatform 50 with an integral heater layer 52 and four support microbeams 54, 56, 58 and 60, as one cell of a plurality of cells in an array. Microbeams 54 and 56 each contain a metal interconnect 62, 64, respectively, for powering the heater layer 52. The other two microbeams contain no conductive films and are used only for support and horizontal alignment of microplatform 50.

Figure 3B:
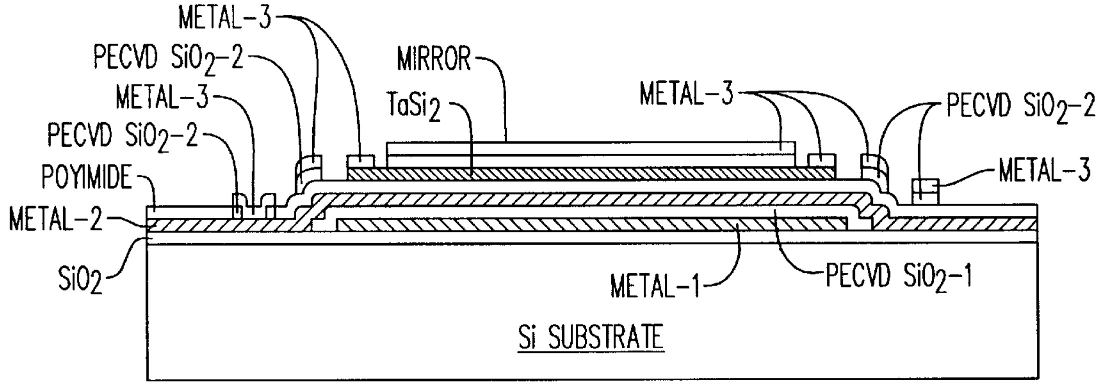
FIG. 3*b* is a sectional view of the microplatform structure of FIG. 3*a*, along line A–A'.
Figure 3C:
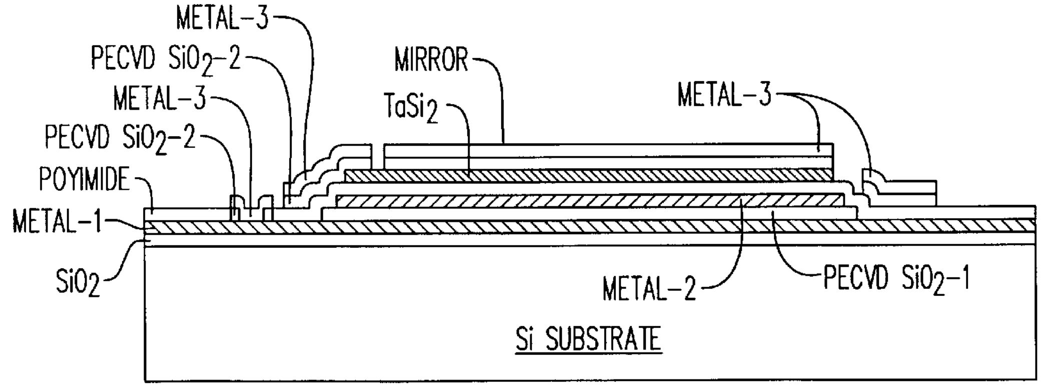
FIG. 3*c* is a sectional view of the microplatform structure of FIG. 3*a*, along line B–B'.

The structure shown in FIG. 3*a* is an addressable cell and includes underlying patterned metal traces for row and column address lines (not shown). Each cell has connections to a row address trace and to a column address trace. The top view shown in FIG. 3*a* includes support beams that are located outside (not underneath) microplatform 50. The support beams can also be positioned underneath microplatform 50, although the manufacturing complexity increases in such an arrangement. FIGS. 3*b* and 3*c* are two sections of FIG. 3*a*, shown for clarity, FIG. 3*b* taken along line A–A' and FIG. 3*c* taken along line B–B'.

Microplatform 50 of FIG. 3 contains multiple films of materials patterned over a starting wafer of single crystal silicon which has been oxidized in an oxygen ambient to achieve a surface film of $SiO_2$ about 200 nanometers in thickness. The first metal (Metal-1) is aluminum that is sputtered on the oxidized silicon substrate at 200° C. and then patterned, using standard lithographic techniques. The first metal is then covered with a 300 nanometer film of silicon dioxide deposited using plasma-enhanced low pressure chemical vapor deposition (LPCVD) at 300° C. This resulting silicon dioxide film (PECVD $SiO_2$-1) is patterned and followed by a second metal film of aluminum (Metal-2) that is sputtered and patterned in the same manner as the first metal film. The first and second metal films form the column and row address lines for the cell of FIG. 3 (which is part of a larger array).

Next, polyimide is spin coated on the wafer, baked, and patterned. The layer of polyimide is about 1000 nanometers in thickness and forms the layer to be sacrificed toward the end of the fabrication process. Next tantalum silicide is sputtered at a temperature of 250° C. and is patterned to form the resistive heater and to provide the structure for the microplatform area. A second layer of PECVD $SiO_2$ is now deposited at 300° C. to form a dielectric insulating film over the tantalum silicide. Finally, a third film of aluminum (Metal-3) is sputtered at 200° C. and is patterned to form a reflecting mirror on the microplatform. The third film of aluminum also forms the metal electrical interconnects on the microbeams between the address Metal-1 and Metal-2, which connect through the tantalum silicide resistive heater integral to the microplatform.

Two of the support microbeams contain the bimorph aluminum-silicon dioxide sandwich structure which causes the upward actuation of the microplatform, upon release. The two additional support microbeams are bimorphs of silicon dioxide and aluminum also; they provide upward actuation of the microplatform also upon release but do not provide electrical interconnects. These additional two non-electrically conducting beams can be omitted if greater thermal isolation is required for the microplatform.

Next, the structured wafer is subjected to an oxygen plasma etch at 200° C. for approximately one hour to remove the polyimide film and to release the microplatform upward.

The cell structure shown in detail in FIGS. 3*a*–3*c* is typically replicated many times over on the supporting substrate wafer to form an addressable array. For structures in which only a single cell is required, such as a thermopile discrete infrared detector, the underlying aluminum (Metal-1 and Metal-2) patterned films for array addressing are not required.

FIGS. 4*a*–4*d* show a further embodiment of the invention wherein the microplatform and support beam structure are constructed as shown in FIG. 1*a,* but with a heater derived in a different manner. In this embodiment, the heater is a separate structure which underlies the microplatform. Upon being heated, the heater actuates upward to touch the microplatform, and upon cooling, the heater moves downward and away from the microplatform. In this manner, the microplatform can be heated quickly by direct thermal conduction when the hot heater touches the microplatform. When the heater structure cools and retracts downward, the thermal microplatform is isolated thermally and thus retains its temperature for a longer period of time. The cell shown in FIG. 4*a*–4*d* can be constructed with very low thermal conductivity microbeams (e.g., silicon dioxide and silicon nitride) to support the microplatform.

Figure 4A:
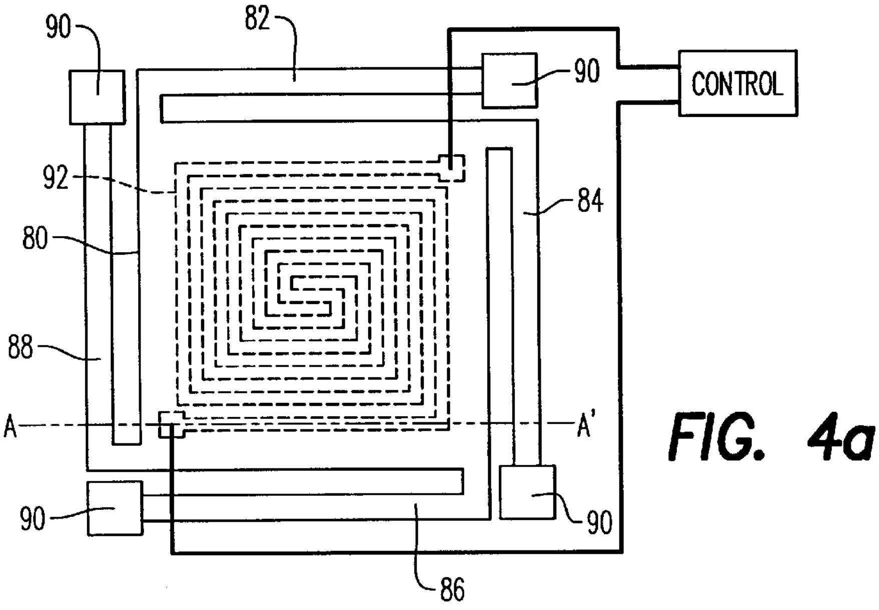
FIG. 4*a* is a top view of a microplatform with a retractable spiral microheater underneath.
Figure 4B:
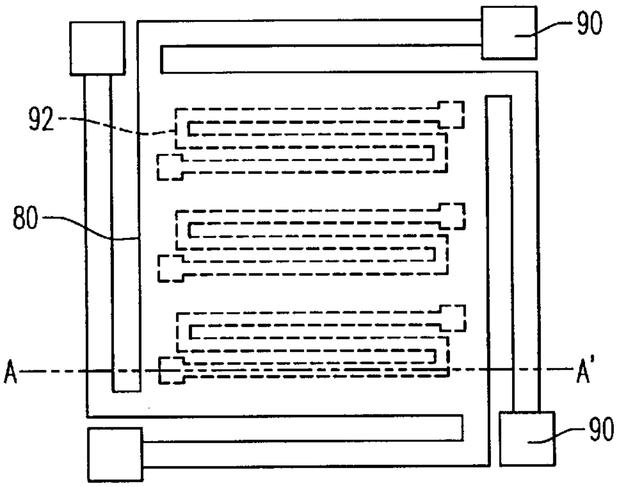
FIG. 4*b* is a top view of microplatform with a retractable microheater underneath, wherein the heater is shaped in serpentine segments.

In FIGS. 4*a* and 4*b* the top view of the cell is shown and includes sufficient detail only to illustrate a microplatform 80 constructed with four low thermal conductance microbeams 82, 84, 86 and 88 which extend from tether points 90 to platform 80. Beneath microplatform 80, an underlying actuating heater element 92 is positioned out of contact therewith.

FIG. 4*a* shows underlying heater element 92 in the form of a spiral which has been released from the substrate, and is tethered at two ends to the substrate. Heater element 92 is formed of a multimorph (bimorph in this example) which actuates upward upon heating. The material layers in heater element 92 comprise a top layer of lower TCE material, and a lower layer with a higher TCE. For a preferred heater element 92, a top layer of PECVD $SiO_2$ and a lower layer of tantalum silicide are used. The lower silicide layer forms the electrical heater while the upper $SiO_2$ layer forms the necessary bimorph structure to cause upward movement of the heater element upon heating. A further preferred embodiment of heater element 92 comprises an upper element of tantalum silicide and a lower layer of aluminum, separated by a thin dielectric layer of PECVD $SiO_2$ in a multimorph configuration. In the latter case, either layer may be used as the heater although the higher resistivity tantalum silicide layer is generally more suitable to the particular application. Two levels of sacrificial film are used: one above and one below the actuated heater.

FIG. 4*b* shows heater element 92 divided into multiple heater elements to provide control over the distribution of heating and/or to provide redundance in the heater element structure.

Figure 4C:
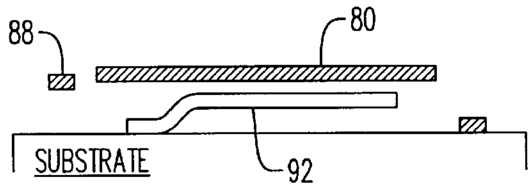
FIG. 4*c* is a side sectional view along line A–A' of the microplatform of FIGS. 4*a* and 4*b*, wherein the underlying heater is not powered and is in a relaxed position not touching the microplatform.

FIG. 4*c* is a side sectional view of FIGS. 4*a* and 4*b* along line A–A', showing microplatform 80 overlying an unheated heater element 92. FIG. 4*c* shows that unheated heater element 92 is retracted and does not touch microplatform 80.

Figure 4D:
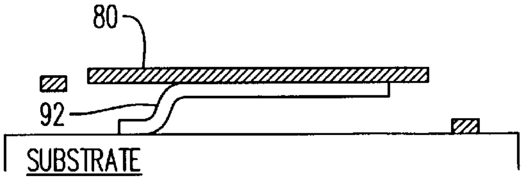
FIG. 4*d* is a side sectional view along line A–A' of the microplatform of FIGS. 4*a* and 4*b* wherein the underlying heater is powered. The heater is thereby actuated upward, touching the microplatform and increasing the heat transfer from the heater into the microplatform.

FIG. 4*d* is a side sectional view of FIGS. 4*a* and 4*b*, taken along line A–A', showing the position of heater element 92 after being powered up to full temperature. When the temperature of heater element 92 increases, the central position of its structure actuates upward and physically touches microplatform 80, thereby providing a thermal conduction path from heater element 92 into microplatform 80.

In operation, heater element 92 is cycled between conditions shown in FIG. 4*c* and FIG. 4*d*, in sequence. When heater element 92 is retracted following a heating event, microplatform 80 is insulated from the heat sink effect that would result if heater element 92 stayed in contact and cooled. Thus microplatform 80 is more fully thermally isolated following a heating event. If special care is used to construct the microbeams of low thermal conductivity materials, a high degree of thermal isolation can be obtained for microplatform 80.

Figure 5A:
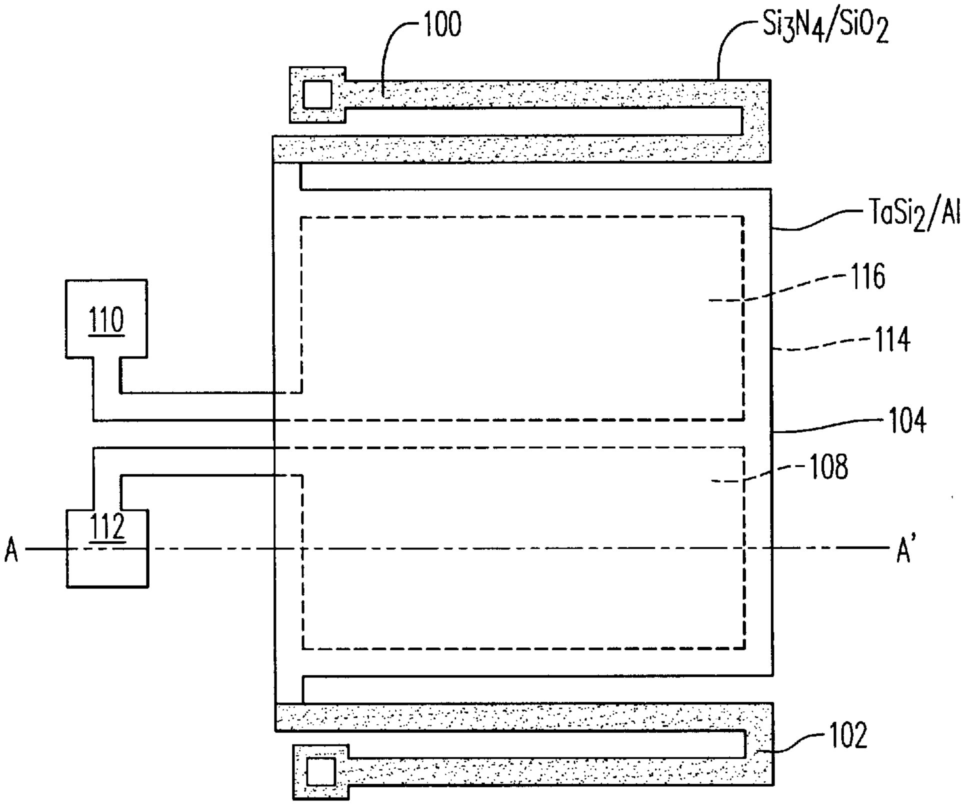
FIG. 5*a* is a top view of a bolometer cell, showing two support microbeams and underlying capacitor plates.
Figure 5B:
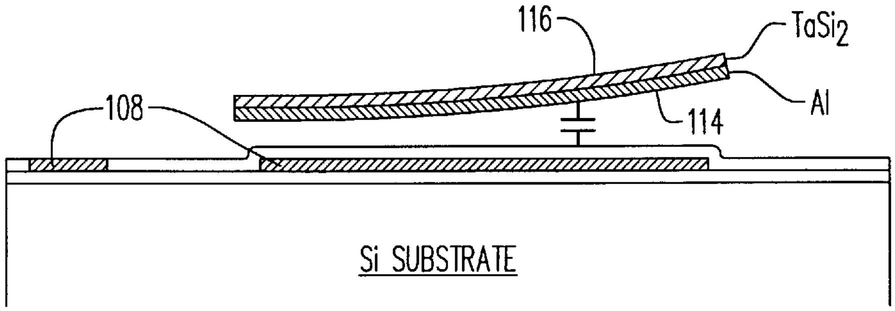
FIG. 5*b* is a side sectional view of the bolometer cell of FIG. 5*a*, along line A–A', showing the cantilevered microplatform structure above the capacitor plates.

FIGS. 5*a* and 5*b* illustrate the application of a microplatform to form a highly sensitive bolometer cell in which capacitance between two substrate capacitor plates change with the temperature of the microplatform. In this case the microplatform is actuated upward by low thermal conductivity support beams upon release as described for FIG. 1. The microplatform further contains a multimorph (e.g., a bimorph of tantalum silicide and aluminum in a preferred embodiment) which hinges upward or downward with an increase in temperature or a decrease in temperature, respectively.

FIG. 5*a* shows the top view of a bolometer cell containing two support beams 100, 102 securing a microplatform 104 so as to provide for a hinge-like movement along the left edge of microplatform 104. Microplatform 104 and untethered portions of support microbeams 100 and 103 are released following the removal of a sacrificial polyimide film, using techniques discussed above for FIG. 3.

Underlying microplatform 104 is a split-capacitor electrode structure, fixed to the supporting substrate and including plates 106 and 108. The capacitance between connections 110 and 112 to the split electrode structure varies as the microplatform hinges. An underlying layer of aluminum 114 on microplatform 104 forms a covering plate for the capacitor. The overlying layer of microplatform 104 is a layer of tantalum silicide 116, thereby rendering microplatform into a bimorph which deflects in response to heating events. Thus, the capacitance of the structure shown in FIG. 5 is a sensitive function of the temperature of microplatform 104.

FIG. 5*b* shows the side view section of FIG. 1*a,* taken along line A–A' in FIG. 5*a,* with microplatform 104 positioned by the support microbeams 100 and 102 to overlie the split capacitor electrodes 106 and 108 (that are electrically insulated from the substrate). This structure can be constructed with an area varying from 10 nanometers by 10 nanometers up to 1 cm by 1 cm in size. The support microbeams can actuate microplatform 104 upward to desired heights ranging from 1 micrometer to 1 millimeter.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A micromachined platform structure comprising:

a substrate having a major surface;

a platform positioned away from said major surface;

plural support beams tethered between said substrate and said platform, each said support beam comprising at least a first layer exhibiting a first thermal coefficient of expansion (TCE) and a second layer with a second TCE, said first TCE greater than said second TCE, said first layer deposited on said second layer at a temperature that is higher than an ambient temperature at which said platform is to be used, said first layer, at said ambient temperature, having contracted and in tension relative to said second layer, causing a flexure of said beam to elevate said platform to a static position away from said major surface.

2. The micromachined platform structure as recited in claim 1, wherein said first layer and second layer of at least some of said plural support beams are both insulating materials.

3. The micromachined platform structure as recited in claim 1, wherein said platform comprises a resistive heater element and wherein at least one of said first layer or said second layer of at least some of said plural support beams is a conductor material which enables application of a heater current to said resistive heater element.

4. The micromachined platform structure as recited in claim 1, further comprising:

a heater structure positioned between said substrate and said platform and comprising plural layers exhibiting different TCEs, said heater structure responsive to an applied heater current to deflect into contact with said platform and thereby provide a heating thereof.

5. The micromachined platform structure as recited in claim 4 wherein said heater structure retracts away from said platform upon cooling to enable increased thermal isolation of said platform and a decreased rate of cooling thereof.

6. The micromachined platform structure as recited in claim 5, wherein said heater structure comprises a plurality of independently controllable heater elements.

7. The micromachined platform structure as recited in claim 5, wherein said heater structure comprises a spiral structure.

8. A micromachined platform structure comprising:

a substrate having a major surface;

capacitive plate means formed on said substrate;

a platform positioned away from said major surface and comprising plural layers exhibiting different thermal coefficients of expansion (TCEs), at least one of said layers comprising a conductive material, said platform responsive to applied heat to move with respect to said capacitive plate means on said substrate;

plural support beams tethered between said substrate and said platform, each said support beam comprising at least a first layer exhibiting a first TCE and a second layer with a second TCE, said first TCE greater than said second TCE, said first layer deposited on said second layer at a temperature that is higher than an ambient temperature at which said platform is to be used, said first layer, at said ambient temperature, having contracted and in tension relative to said second layer, causing a flexure of said beam to elevate said platform away from said major surface; and means for sensing changes in capacitance between said capacitive plate means and said conductive material of said platform as an indication of a change of temperature of said platform.

9. The micromachined platform structure as recited in claim 8, wherein said capacitive plate means comprise a pair of plates and said conductive material of said platform is positioned to substantially cover said pair of plates.

10. The micromachined platform structure as recited in claim 8, wherein said first layer and said second layer of said plural support beams are low thermal conductance materials.

11. A method for configuring a micromachined platform structure, said structure including a substrate having a major surface, a platform positioned upon a sacrificial material on said major surface and plural support beams tethered between said substrate and said platform, each support beam comprising at least a first layer exhibiting a first thermal coefficient of expansion (TCE) and a second layer with a second TCE, said first TCE greater than said second TCE, said method comprising the steps of:

depositing said first layer on said second layer at a temperature that is higher than an ambient temperature at which said platform is to be used, said first layer thus being in tension at said ambient temperature;

removing said sacrificial layer to enable, at said ambient temperature, said first layer to cause a flexure of said support beams to elevate said platform to a static position away from said major surface.

12. The method as recited in claim 11 wherein a heater structure is positioned between said substrate and said platform, said heater structure comprising plural layers exhibiting different TCEs, said method comprising the further step of:

applying a heater current said heater structure to deflect said heater structure into contact with said platform to thereby provide a heating thereof.

13. A method for configuring a micromachined platform structure that includes a substrate having a major surface, capacitive plate means formed on said substrate, a platform positioned on a sacrificial layer attached to said substrate, said platform comprising plural layers exhibiting different thermal coefficients of expansion (TCEs), at least one of said layers comprising a conductive material, said platform responsive to applied heat to move with respect to said capacitive plate means on said substrate, and plural support beams tethered between said substrate and said platform, each said support beam comprising at least a first layer exhibiting a first TCE and a second layer with a second TCE, said first TCE greater than said second TCE, said method comprising the steps of:

depositing said first layer on said second layer at a temperature that is higher than an ambient temperature at which said platform is to be used, said first layer thus being in tension at said ambient temperature;

removing said sacrificial layer to enable, at said ambient temperature, said first layer to cause a flexure of said support beams to elevate said platform to a static position away from said major surface; and sensing changes in capacitance between said capacitive plate means and said conductive material of said platform as an indication of a change of temperature of said platform.

* * * * *